United States Patent
Murakami et al.

(10) Patent No.: US 11,887,802 B2
(45) Date of Patent: Jan. 30, 2024

(54) ELECTRON EMITTING ELEMENT AND METHOD FOR MANUFACTURING SAME

(71) Applicant: NATIONAL INSTITUTE OF ADVANCED INDUSTRIAL SCIENCE AND TECHNOLOGY, Tokyo (JP)

(72) Inventors: Katsuhisa Murakami, Tsukuba (JP); Masayoshi Nagao, Tsukuba (JP)

(73) Assignee: NATIONAL INSTITUTE OF ADVANCED INDUSTRIAL SCIENCE AND TECHNOLOGY

( * ) Notice: Subject to any disclaimer, the term of this patent is extended or adjusted under 35 U.S.C. 154(b) by 0 days.

(21) Appl. No.: 17/912,659

(22) PCT Filed: Mar. 16, 2021

(86) PCT No.: PCT/JP2021/010617
§ 371 (c)(1),
(2) Date: Sep. 19, 2022

(87) PCT Pub. No.: WO2021/193237
PCT Pub. Date: Sep. 30, 2021

(65) Prior Publication Data
US 2023/0134647 A1 May 4, 2023

(30) Foreign Application Priority Data
Mar. 23, 2020 (JP) .................. 2020-051288

(51) Int. Cl.
*H01J 1/312* (2006.01)
*H01J 1/90* (2006.01)
(Continued)

(52) U.S. Cl.
CPC ............ *H01J 1/312* (2013.01); *C23C 16/342* (2013.01); *H01J 1/90* (2013.01); *H01J 9/027* (2013.01); *H01J 2209/012* (2013.01)

(58) Field of Classification Search
CPC ..................... H01J 1/312; H01J 1/90
See application file for complete search history.

(56) References Cited

U.S. PATENT DOCUMENTS

| 6,818,941 B1 | 11/2004 | Suzuki et al. ............. 257/310 |
| 2003/0076023 A1 | 4/2003 | Komoda et al. ........... 313/310 |

(Continued)

FOREIGN PATENT DOCUMENTS

| JP | 2003187688 A | 7/2003 |
| JP | 2007264429 A | 10/2007 |

(Continued)

OTHER PUBLICATIONS

International Search Report dated May 25, 2021 in corresponding PCT International Application No. PCT/JP2021/010617.

*Primary Examiner* — Joseph L Williams
(74) *Attorney, Agent, or Firm* — OSTROLENK FABER LLP

(57) ABSTRACT

Provided in the present disclosure is an electron emitting element 10 including a laminated structure in which a first electrode 1, an electron accelerating layer 6 made of an insulation film, a second electrode 3, and a cover film 7 are laminated in that order, in which the second electrode is an electrode which transmits electrons and emits electrons from a surface thereof, and the cover film is a film which transmits electrons, is a protective film made of a material different from that of the second electrode, and constitutes an electron emission surface 5.

15 Claims, 6 Drawing Sheets

(51) Int. Cl.
　　　*C23C 16/34*　　　(2006.01)
　　　*H01J 9/02*　　　(2006.01)

(56) References Cited

U.S. PATENT DOCUMENTS

2007/0231010 A1　　10/2007　Ohta et al. .................... 399/168
2011/0129256 A1　　6/2011　Hirakawa et al. ............ 399/168

FOREIGN PATENT DOCUMENTS

| JP | 2008519423 A | 6/2008 |
|---|---|---|
| JP | 2011119071 A | 6/2011 |
| JP | 2013037784 A | 2/2013 |
| JP | 2016136485 A | 7/2016 |
| JP | 2017045639 A | 3/2017 |
| JP | 2019071260 A | 5/2019 |
| JP | 2019216095 A | 12/2019 |
| WO | WO 00/74098 A1 | 12/2000 |

ELECTRON EMITTING ELEMENT AND METHOD FOR MANUFACTURING SAME

CROSS-REFERENCE TO RELATED APPLICATIONS

The present application is a 35 U.S.C. §§ 371 national stage application of International Application No. PCT/JP2021/010617, filed Mar. 16, 2021, which claims priority to Japanese Patent Application No. 2020-051288, filed Mar. 23, 2020, the contents of which are incorporated herein by reference.

TECHNICAL FIELD

The present invention relates to an electron emitting element for emitting electrons and a method for manufacturing the same.

BACKGROUND ART

Conventionally, a cold cathode type electron source and a hot cathode type electron source are known as an electron emitting element (also referred to as "electron source") that emits electrons from atoms to the outside. A cold cathode type electron source applies an energy, which is used to be ejected from the cathode, to electron due to a high voltage which is applied between a cathode and an anodes. Technologies related to the cold cathode type electron source are being developed in fields of, for example, flat display devices, lighting, hydrogen generation devices, electron microscopes, or the like.

A thin film electron source configured by a laminated structure of thin films and used for flat display devices or the like is known. The thin film electron source has a structure in which an upper electrode, an electron accelerating layer, and a lower electrode are laminated, and emits electrons which are accelerated in the electron accelerating layer into a vacuum. Examples of the thin film electron source includes, for example, a metal-insulator-metal (MIM, metal-insulator-metal) type electron source, a metal-oxide-semiconductor (MOS) type electron source, a ballistic surface electron source, and the like. The upper electrode is also called a surface electrode or an electron-transmitting electrode, and constitutes an electron emission surface. Since the thin film electron source does not have a needle or filament structure, it is also called a planar electron emitting element. The planar electron emitting element is not necessarily limited to a flat plate, and may have a thin film laminated structure having a curved surface that is not in a shape of a needle or filament. The planar electron emitting element has features such as high stability of emitted electrons, high straightness of emitted electrons, being operable at a low voltage of 10 V or less, being operable stably even in a low vacuum, being able to perform surface emission of electrons, and being able to be manufactured by an existing semiconductor process.

FIG. 1 is a cross-sectional view schematically illustrating a configuration of a conventional electron emitting element 300 (see Patent Literature 1 or the like). The electron emitting element 300 is constituted by a lower electrode substrate 301, an insulator layer 302, and an electron-transmitting electrode layer 303. As a material of the electron-transmitting electrode layer 303, a noble metal such as gold, platinum, iridium or the like is used to prevent a work function from increasing due to an influence of oxidation or the like. The insulator layer 302 has a thickness of 5 nm to 20 nm at a portion thereof, functions as an electron accelerating layer, and forms an electron emission surface by laminating the electron-transmitting electrode layer 303 thereon. The insulator layer 302 located in a portion other than the electron emission surface is thicker than the electron emission surface and has a thickness of about several tens of nm to several hundreds of nm. A contact electrode layer 304 for applying a voltage is provided on a portion of the electron-transmitting electrode layer 303 that does not overlap the electron emission surface 305.

As an element for emitting electrons to the outside of a solid, the present inventors have proposed an electron emitting element having a graphene/insulation film/silicon laminated structure using graphene or the like as an electron-transmitting electrode (see Patent Literature 1).

The present inventors have proposed an electron source having a structure in which an upper electrode, an electron accelerating layer, and a lower electrode are laminated, and in which a graphene film or a graphite film is used as the upper electrode that constitutes an electron emission surface, a part or all of the upper electrode and the lower electrode have curved surfaces, and the electron emission surface is a curved surface (see Patent Literature 2).

Furthermore, an electron emitting element can separate molecules by emitting electrons in a gas atmosphere or in a liquid and causing the electrons to collide with the gas or liquid. A hydrogen production device using an electron emitting element has been proposed (see Patent Literature 3). For example, the present inventors have proposed to provide a protective layer made of a graphene layer or a graphite layer on a surface of a contact electrode layer in the electron emitting element (see Patent Literature 3).

CITATION LIST

Patent Literature

Patent Literature 1: Japanese Unexamined Patent Application, First Publication No. 2017-45639
Patent Literature 2: Japanese Unexamined Patent Application, First Publication No. 2019-71260
Patent Literature 3: Japanese Unexamined Patent Application, First Publication No. 2019-216095

SUMMARY OF INVENTION

Technical Problem

A conventional electron source, for example, having a graphene/insulation film/silicon laminated structure described in Patent Literature 1 can emit electrons not only in a high vacuum but also in a pressure from a low vacuum to an atmospheric pressure. For example, it is possible to decompose a gas by directly injecting electrons accelerated to about 10 eV into the gas. Also, it is similarly possible to separate molecules of a liquid by injecting a gas into the liquid.

Also, the present inventors have proposed an electron emitting element having a laminated structure in which a lower electrode made of a semiconductor or a magnetic material, an electron accelerating layer made of an insulation film, and an upper electrode are laminated in that order, and in which the upper electrode is an electrode that transmits electrons and emits electrons from a surface thereof, and an energy width of the emitted electrons is 100 meV or more and 600 meV or less (see Japanese Patent Application No. 2019-88138). This proposal was for realizing a small energy width of electrons by suppressing scattering of electrons in the insulation film and the electron-transmitting electrode film to the utmost limit. In this proposal, graphene of 1 or more layers and 20 or less layers is used for the upper electrode. Also, hexagonal boron nitride is used for the insulation film of the electron accelerating layer.

However, when a material which reacts with oxygen such as graphene is used as the electron-transmitting electrode, a problem in which an electron emission efficiency is lowered occurs. When the electron emitting element is an element which is used in a pressure from a low vacuum to an atmospheric pressure, and especially when oxygen is present as a residual gas in the gas or the low vacuum, the oxygen is excited and generates oxygen radicals by electrons emitted from the electron emitting element. A surface of the electron-transmitting electrode is attacked by the oxygen radicals, and for example, when the electron-transmitting electrode is graphene, there is a problem that graphene reacts with the oxygen and disappears as $CO_2$. Therefore, even if the electron emitting element can be operated in a gas or a low vacuum, it could not be used unless in an environment in which an oxygen partial pressure was extremely low.

In addition, not only in an oxygen atmosphere but also in a gas containing oxygen molecules such as $CO_2$, there is a problem that a gas is decomposed by emitted electrons and oxygen radicals are generated. Therefore, the electron emitting element could not be used unless in an environment in which a partial pressure of the gas containing oxygen molecules was extremely low.

The electron emitting elements as disclosed in Patent Literature 1 to 3 can be considered to be used in outer space. As a propulsion machine for an artificial satellite, there is a propulsion machine called an ion thruster that emits ions to outer space to control an attitude of the artificial satellite. Ions that are normally emitted often have only a positive charge. Therefore if the ion thruster continues to emit ions, there is a problem that the satellite itself will be charged up negatively, the emitted ions will return to the satellite, and propulsion cannot be obtained. Therefore, in order to maintain the charge balance, it is necessary to also emit electrons. As an electron emitting element used for such an application, it is desired to efficiently emit electrons at a low voltage. Since emitting electrons does not contribute to the propulsion and the satellite needs to operate with a limited power supply in outer space, efficiency thereof is the most important factor. As described above, the electron emitting element proposed by the present inventors is capable of emitting electrons at a low voltage of a ten and several volts and has a very high efficiency of 20 to 50%, and is expected as an electron source used for the above-described applications.

However, in a case of a neutralizing gun for an electric propulsion machine which is used in outer space, there is a problem that graphene disappears due to atomic oxygen. This is because, for example, although it depends on an altitude from the ground surface, atomic oxygen having a concentration of about $8 \times 10^{13}$ [atoms/m$^3$] is present in outer space at an altitude of 400 km from the ground surface.

The present invention is intended to solve these problems, and an objective of the present invention is to provide an electron emitting element that prevents an electron-transmitting electrode from being damaged or chemically changed by being exposed to a gas, a gas in a liquid, or the like, can operate stably in an oxygen atmosphere, a gas containing oxygen atoms, and other reactive gases by imparting oxygen resistance or the like, and has an higher electron emission efficiency.

Solution to Problem

The present invention has the following features to achieve the above-described objective.

(1) An electron emitting element including a laminated structure in which a first electrode, an electron accelerating layer made of an insulation film, a second electrode, and a cover film are laminated in that order, in which the second electrode is an electrode which transmits electrons and emits electrons from a surface thereof, and the cover film is a film which transmits electrons, is a protective film made of a material different from that of the second electrode, and constitutes an electron emission surface thereof.

(2) The electron emitting element according to the above-described (1), in which the cover film is a film inert to oxygen or a film having higher corrosion resistance than the second electrode.

(3) The electron emitting element according to the above-described (1) or (2), in which a film thickness of the cover film is configured so that a reduction rate of an electron emission efficiency due to the cover film is 90% or less compared to a case without the cover film.

(4) The electron emitting element according to any one of the above-described (1) to (3), in which the cover film is made of hexagonal boron nitride.

(5) The electron emitting element according to the above-described (4), in which the cover film is made of hexagonal boron nitride of 1 or more layers and 39 or less layers.

(6) The electron emitting element according to the above-described (4) or (5), in which the second electrode is a graphene film or a graphite film.

(7) The electron emitting element according to the above-described (6), in which the graphene film is a polycrystalline graphene film which consists of one carbon layer, and the graphite film is a polycrystalline graphite film which consists of 20 or less carbon layers.

(8) The electron emitting element according to the above-described (6) or (7), in which the graphene film and the graphite film are doped with nitrogen.

(9) The electron emitting element according to any one of the above-described (4) to (8), in which the electron accelerating layer is made of hexagonal boron nitride.

(10) The electron emitting element according to the above-described (4) or (5), in which the second electrode is a metal electrode.

(11) The electron emitting element according to any one of the above-described (1) to (3), in which the cover film is a film of one or two or more layers selected from $MoS_2$, $MoSe_2$, $WS_2$, $WSe_2$, GaS, and GaSe.

(12) The electron emitting element according to any one of the above-described (1) to (3), in which the cover film is a film of one or two more layers selected from $SiO_2$, $Al_2O_3$, ZrO, $HfO_2$, and $TiO_2$.

(13) The electron emitting element according to the above-described (11) or (12), in which the second electrode is a graphene film or a graphite film.

(14) The electron emitting element according to the above-described (13), in which the graphene film is a polycrystalline graphene film which consists of one carbon layer, and the graphite film is a polycrystalline graphite film which consists of 20 or less carbon layers.

(15) The electron emitting element according to the above-described (13) or (14), in which the graphene film and the graphite film is doped with nitrogen.

(16) The electron emitting element according to the above-described (11) or (12), in which the second electrode is a metal electrode.

(17) A manufacturing method for an electron emitting element including a step of forming a first electrode, a step of forming a first insulation film, which limits a region of an electron emission surface, on a part of a surface of the first electrode, a step of forming an electron accelerating layer which is made of an insulation film and covers the first electrode and the first insulation film, and a step of forming a cover film, which transmits electrons, on a region of the electron emission surface of the electron accelerating layer.

(18) The manufacturing method according to the above-described (17), in which the cover film is a hexagonal boron nitride film, and the hexagonal boron nitride film which covers the electron accelerating layer is formed in the step of forming the cover film by transferring a hexagonal boron nitride film which is formed on a substrate on the region of the electron emission surface of the electron accelerating layer.

(19) The manufacturing method according to the above-described (17), in which the cover film is a hexagonal boron nitride film, and the boron nitride film which covers the electron accelerating layer is formed by a chemical vapor deposition method using diborane and ammonia, boron trichloride and ammonia, ammonia borane, or borazine as raw materials in the step of forming the cover film.

Effects of the Invention

According to the present invention, since the cover film which transmits electrons is further provided on the electron-transmitting electrode, the electron-transmitting electrode is prevented from being damaged or chemically changed by being exposed to a gas such as oxygen, or an acid or an alkaline solution in a gas or liquid. The cover film serves the role of protecting the electron-transmitting electrode. As a result, characteristics of the high-performance electron emitting element can be maintained. For example, in the present invention, even if electrons are emitted in a gas atmosphere or a liquid and molecules in a medium thereof are separated to generate oxygen radicals, since a surface of the electron-transmitting electrode is covered with a protective film that is inert to a corrosive gas such as oxygen, or a liquid, a phenomenon in which the electrode does not function as an electrode due to a reaction with oxygen or the like is suppressed, and the surface disappearing due to a reaction with oxygen does not occur. As a result, the electron emitting element can be stably operated.

For example, when the cover film is a film of one layer or two or more layers selected from hexagonal boron nitride (boron nitride having a hexagonal structure, hereinafter also referred to as h-BN), $MoS_2$, $MoSe_2$, $WS_2$, $WSe_2$, GaS, GaSe, $SiO_2$, $Al_2O_3$, ZrO, $HfO_2$, and $TiO_2$, the protective role is significant.

Since a film thickness can be selected and formed so that a reduction rate of an electron emission efficiency due to the cover film is within a predetermined percentage, an excellent element with a stable electron emission efficiency can be realized according to an environment or application in which it is used.

When the protective film is made of hexagonal boron nitride, scattering of transmitting electrons is very small compared to that of other substances, and thereby electrons can be emitted without significantly lowering the electron emission efficiency and without extending the energy width of the electrons.

In the present invention, when a carbon film such as graphene or graphite is used for the electron-transmitting electrode, since a surface of the carbon film is covered with the protective film inert to oxygen or the like by further providing the cover film on the carbon film, the electron emitting element can be stably operated without the carbon surface failing to function as an electrode due to a reaction with oxygen or disappearing due to the reaction with oxygen.

DESCRIPTION OF EMBODIMENTS

Figure 1:
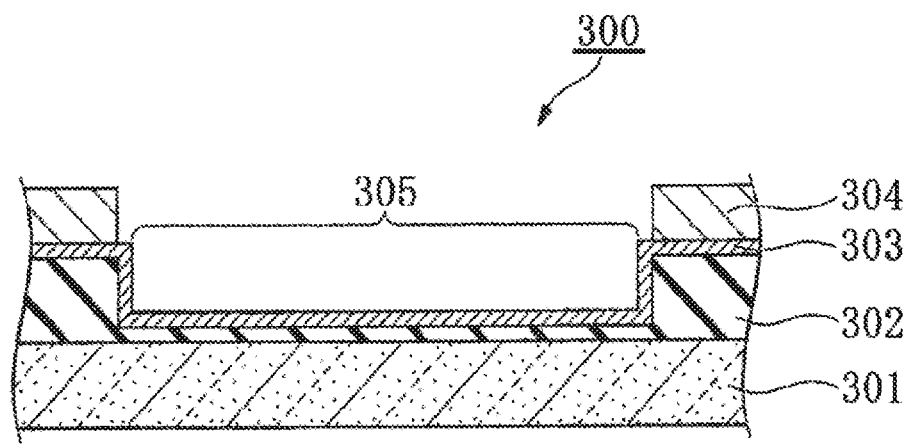
FIG. 1 is a schematic view illustrating a structure of an electron emitting element in an conventional technology.

Embodiments of the present invention will be described below.

The present inventor has researched and developed focusing on a material of an electron emission surface of a thin film laminated structure in an electron emitting element, and has come to obtain an electron emitting element in which an electron emission efficiency is improved.

The electron emitting element of the embodiment of the present invention has a structure in which a first electrode (also referred to as a "lower electrode"), an electron accelerating layer made of an insulation film, a second electrode (also referred to as "upper electrode, surface electrode, electron-transmitting electrode"), and a cover film are laminated in that order. The second electrode is an electrode that transmits electrons. A cover film that transmits electrons is provided on a surface of the second electrode, and a surface of the cover film located on the surface of the second electrode forms an electron emission surface. The electron emission surface of the electron emitting element of the present invention is not necessarily limited to a flat plate, but also includes a thin film laminated structure having a curved surface that is not in a shape of a needle or filament.

An operating principle of the electron emitting element will be described below. When a positive bias is applied to the upper electrode (or a negative bias is applied to the lower electrode), an electric field is generated in the insulation film between the upper electrode and the lower electrode, and a shape of a potential barrier of the insulation film becomes triangular. When the applied bias is increased and the electric field applied to the insulation film becomes a high electric field (109 V/m), a width of the potential barrier becomes smaller, and electrons in the lower electrode are tunneled through a conduction band of the insulation film due to a quantum mechanical tunneling effect. The electrons tunneled through the conduction band travel through the insulation film due to the high electric field and are emitted through the upper electrode. Therefore, the upper electrode is called an electron-transmitting electrode. It is known from studies such as the above-described prior art literature that it is possible to suppress electron scattering in an electron-transmitting electrode by using graphene or graphite for the electron-transmitting electrode. It is predicted that an electron emission efficiency can be increased up to a maximum of about 70%.

As an insulation film that functions as an electron accelerating layer, a material used for conventional planar electron emitting elements can be used, and the material is not particularly limited. For example, $SiO_2$, SiN, $Al_2O_3$, h-BN, and MgO can be mentioned. A silicon oxide film or a boron nitride film is more preferable.

As for a film thickness of the insulation film that functions as an electron accelerating layer, it is desirable to appropriately select an optimum thickness for the electron accelerating layer. A film thickness of about 4 nm or more and 20 nm or less is desirable because the electron emission efficiency becomes high. If the thickness is smaller than 4 nm, electrons will directly tunnel through the insulation film with a bias less than a work function of the electron-transmitting electrode. Since directly tunneled electrons do not have enough energy to overcome the work function of the electron-transmitting electrode, the electrons are recovered by the electron-transmitting electrode, and thereby the electron emission efficiency is significantly reduced. Also, when a bias equal to or more than the work function of the electron-transmitting electrode is applied, this is not preferable because the electric field applied to the insulation film increases significantly, dielectric breakdown is likely to occur, and a device life decreases. If the thickness is larger than 20 nm, a contribution of electron scattering in the insulation film is large, energies of most tunnel electrons are reduced to the work function of the electron-transmitting electrode or less to be recovered by the electron-transmitting electrode, and thereby the electron emission efficiency is significantly reduced.

A hexagonal boron nitride (boron nitride with a hexagonal structure, h-BN) thin film is more preferable for an application when it is desired to improve monochromaticity of energy. Since h-BN has a two-dimensional structure similarly to graphene, a film thickness thereof can be controlled by controlling the number of layers. Also, since the atomic number is low and scattering of electrons is small, h-BN can be expected to significantly improve the electron emission efficiency compared to a conventional silicon oxide film. When h-BN is used, electrons with a small energy width can be emitted. Making an energy width of emitted electrons small is particularly important in an application such as an electron microscope.

It is also possible to reduce an energy width of emitted electrons to 0.2 eV or less by optimizing the insulation film and suppressing electron scattering in the insulation film. When $SiO_2$ is used for the insulation film, about 1 to 1.7 eV can be achieved. When h-BN is used for the insulation film, a minimum of 0.18 eV can be achieved.

A metal electrode, a graphene film, a graphite film, or the like is preferably used as the electron-transmitting electrode. In a case of a graphene film or a graphite film, a polycrystalline graphene film of one carbon layer or a polycrystalline graphite film of up to about 20 carbon layers is preferable. Also, as the graphene film or the graphite film, one doped with nitrogen may be used. In a case of the metal electrode, a metal film made of one or more selected from Al, Si, Ti, Cr, Fe, Co, Ni, Nb, Mo, Pt, and Au is preferable. It may be a single layer or a plurality of layers.

The lower electrode is not particularly limited as long as it is a conductive material or a semiconductor material that can be used as an electrode and is a material that can realize the laminated structure of the present invention. For example, a silicon electrode can be mentioned. Silicon having high conductivity is preferable, and N-type silicon in which electrons are present in the conduction band is more preferable. Any type of silicon such as single crystal, polycrystal, or amorphous may be used. Also, as the lower electrode, for example, a magnetic metal electrode can be mentioned.

The cover film is provided for the purpose of protecting the electron emission surface side of the electron-transmitting electrode from oxygen radicals or the like. An oxygen-inert material is used for the cover film. Further, since it is necessary to minimize an interaction with transmitting electrons so as not to reduce an electron emission efficiency, a substance which has a collision cross-section area with respect to electrons as small as possible is desirable. More specifically, it is desirable that a material of the cover film be formed of a light element. Also, in order to be inert to oxygen, a substance having a structure without a dangling bond (unbonded hand) is desirable. A so-called two-dimensional layered substance is desirable. A two-dimensional layered substance refers to a series of substances which has a crystal structure in which bonds between atoms are limited in a layer and layers are bonded only by a weak van der Waals force. As the two-dimensional layered substance, $MoS_2$, $MoSe_2$, $WS_2$, $WSe_2$, GaS, GaSe and the like can be exemplified in addition to hexagonal boron nitride. Hexagonal boron nitride is a more desirable material because it is a two-dimensional layered substance formed only from boron and nitrogen.

Since the cover film constitutes the electron emission surface, it needs to have electron transmittance. Since electron transmittance decreases as a film thickness of the cover film increases, an insulating material that can be deposited by a film thickness being controlled at an atomic level is desirable besides the two-dimensional layered substance. For example, $SiO_2$, $Al_2O_3$, ZrO, $HfO_2$, $TiO_2$, and the like can be mentioned. Considering the electron transmittance, h-BN is most preferable for the cover film. A film thickness of the cover film is preferably configured so that a reduction rate of an electron emission efficiency due to the cover film is within 90%.

First Embodiment

Figure 2:
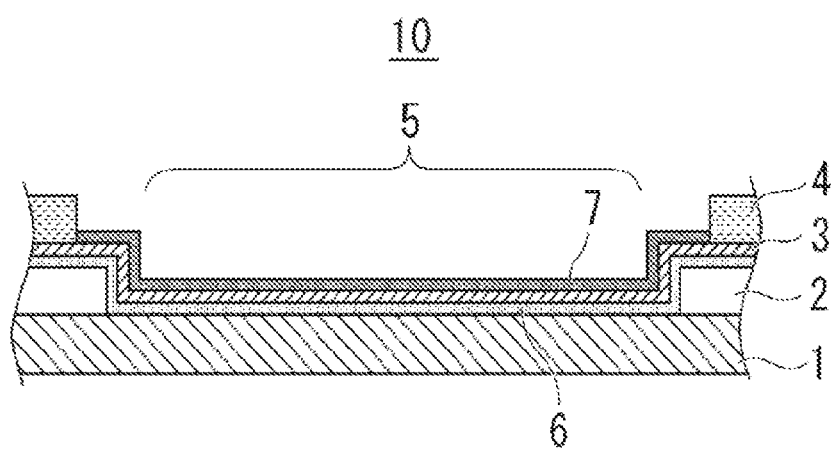
FIG. 2 is a schematic view illustrating a structure of an electron emitting element according to a first embodiment.

The present embodiment will be described below with reference to FIG. 2. The electron emitting element 10 includes a lower electrode 1 (first electrode) formed of a conductive substrate, a thick insulation film 2 that defines an electron emission surface 5, a thin insulation film 6 that functions as an electron accelerating layer of the electron emission surface 5, electron-transmitting electrode 3 (surface electrode, upper electrode, second electrode), a contact electrode 4 (also referred to as a third electrode), and a cover film 7. At least an electron emission surface region of a surface of the electron-transmitting electrode is covered with the cover film 7, and an exposed surface of the cover film 7 constitutes the electron emission surface.

A laminated structure of a region constituting the electron emission surface and a laminated structure of a region not constituting the electron emission surface in the present embodiment are substantially the same as those of the conventional one in FIG. 1 except for a presence of the cover film. The contact electrode 4 for applying a voltage is provided on a portion of the electron-transmitting electrode 3 that does not overlap the electron emission surface 5. A material of the contact electrode is not particularly limited. When a voltage of about 5 V to 20 V is applied between the lower electrode 1 and the contact electrode 4, a potential barrier formed in the insulation film 6 reduces, and electrons in the lower electrode 1 are tunneled through a conduction band of the insulation film 6 due to the quantum mechanical tunneling effect. Electrons reaching the conduction band of the insulation film 6 lose some energy due to scattering of lattice vibration, but electrons having an energy higher than a work function of the electron-transmitting electrode 3 pass through the electron-transmitting electrode 3, further pass through the cover film 7, and are emitted into a gas or a liquid in vacuum, the atmosphere, or the like.

The thick insulation film 2 that defines the electron emission surface 5 and the thin insulation film 6 that functions as an electron accelerating layer of the electron emission surface 5 may be made of the same material or different materials. When silicon is used as the lower electrode 1, a silicon oxide film can be simply used as the insulation film. A hexagonal boron nitride film is used as the insulation film 6 when an electron emission efficiency is desired to be improved or for an application in which an energy width of electrons is desired to be suppressed as much as possible.

In the present embodiment, a silicon semiconductor substrate is used as the lower electrode 1.

The electron-transmitting electrode 3 is a graphene film of one carbon layer or a graphite film of up to about 20 layers. In order to suppress scattering of electrons in the electron-transmitting electrode as much as possible, a single-layer graphene film is more preferable. However, it was ascertained that significant deterioration in the electron emission efficiency was not found in a case of a graphite film of up to about 20 layers. A graphite film of 7 nm corresponds to about 20 layers thereof. Therefore, a film thickness of 2 nm or more and 7 nm or less is more preferable. The graphene film or the graphite film may be a single crystal or a polycrystal. For example, a polycrystalline film in which a size of one crystal grain was about 50 nm or more and 300 nm or less was used for preparing the graphene film, and satisfactory electron emission was obtained. In a case of one-layer graphene, it needs to be a continuous film to emit electrons from the entire surface.

For example, when a hexagonal boron nitride thin film is used for the accelerating layer made of an insulation film and graphene or graphite is used for the electron-transmitting electrode, changes in energy distribution of electrons due to electron scattering inside the electron emitting element can be suppressed. Since the cover film is provided on the electron-transmitting electrode, and the graphene or graphite is not damaged while having the advantage of using graphene or graphite, the electron emission efficiency is high and durability is improved.

Figure 3:
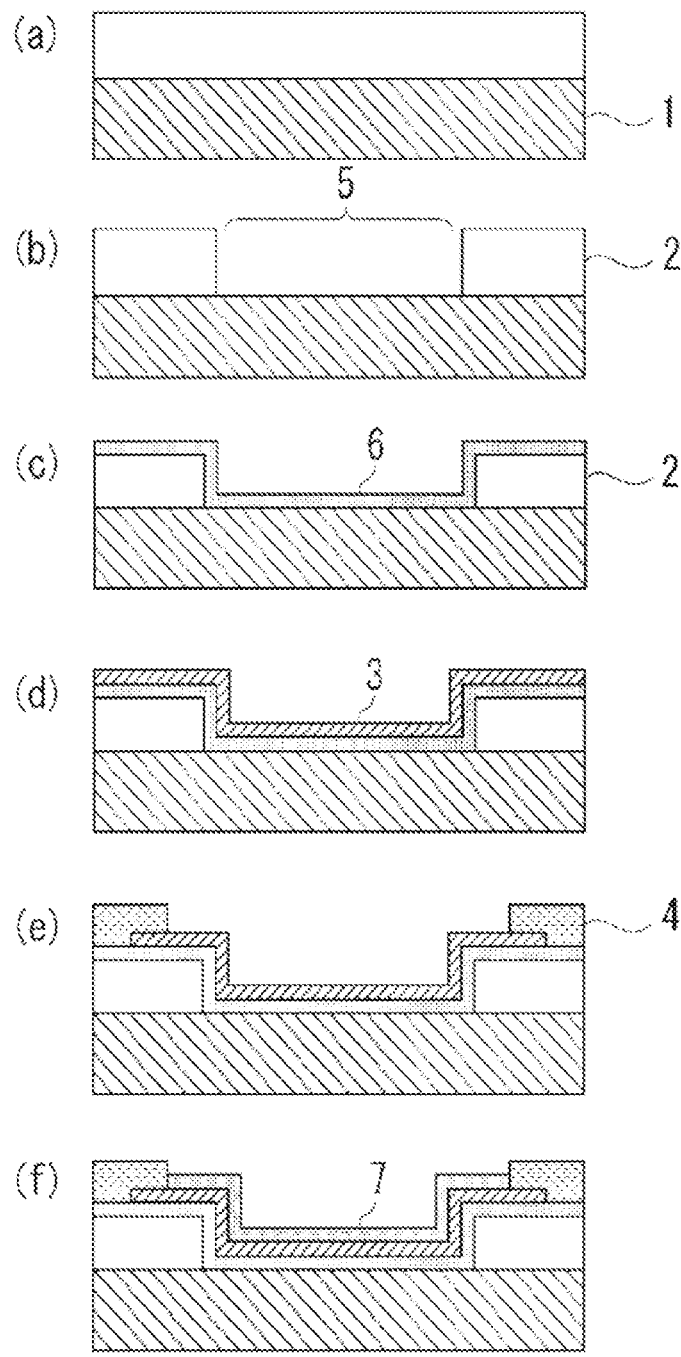
FIG. 3 is a view illustrating a manufacturing process of the electron emitting element according to the first embodiment.

A manufacturing method for an electron emitting element of the present embodiment will be described with reference to FIG. 3.

(Step 1) The lower electrode 1 is prepared. As an example, a single crystal silicon substrate with a thermal oxide film of 300 nm is prepared (see (a) of the figure).

(Step 2) The electron emission surface 5 is defined by using photolithography and etching (see (b) of the figure). As an example, a region in which the thermal oxide film 2 has been removed is a portion of the electron emission surface.

(Step 3) The substrate in step 2 is cleaned to remove impurities. A cleaning method used in the field of semiconductors can be used.

(Step 4) A thin insulation film 6 that functions as an electron accelerating layer is deposited. As an example, when a silicon oxide film is used as the electron accelerating layer, a method with few defects such as thermal oxidation is preferable (see (c) of the figure).

(Step 5) The electron-transmitting electrode 3 is deposited on a surface of the electron accelerating layer (see (d) of the figure). An example of the electron-transmitting electrode 3 is graphene or graphite. A deposition method for graphene or graphite film is not particularly limited. As a method suitable for depositing an electron-transmitting electrode, there is thermal chemical vapor deposition (thermal CVD) or the like using a metal vapor catalyst.

A method for depositing a graphite film using a metal vapor catalyst will be described in detail below. A heating device with a quartz tube inserted into a horizontal electric furnace is prepared. A temperature of the electric furnace is set to about 1050° C., and a mixed gas of methane gas and argon gas is introduced from one side of the quartz tube. Inside the quartz tube, metallic gallium is placed on a quartz boat. On a leeward side of the metallic gallium, a lower electrode having an insulation film which is deposited on a surface on which the graphite film is desired is installed. Graphene of a required film thickness is uniformly deposited on the surface of the insulation film (boron nitride film or the like) on the lower electrode. For example, when the film was deposited in a quartz tube of 1 inch for 30 minutes with argon gas at a flow rate of 100 sccm and methane gas at a flow rate of 1 sccm, a polycrystalline graphite film having a film thickness of 7 nm was uniformly formed on the insulation film (boron nitride film or the like). When the deposition time is reduced, a single-layer polycrystalline graphene film can also be deposited. Further, a set temperature, a deposition time, a ratio of flow rates of the gases, and the like of the electric furnace are not limited to the values disclosed here, and can be appropriately selected according to a required film thickness and crystallinity. Also, a gas to be introduced is not limited to argon and methane. A combination of an inert gas serving as a carrier and a gas serving as a supply source of carbon can be arbitrarily selected. Although gallium has been taken as an example as a material for the metal vapor catalyst, a material thereof is not limited to gallium. In addition to gallium, a metal such as indium can be utilized.

(Step 6) The contact electrode 4 for applying a voltage is formed on a portion of the electron-transmitting electrode 3 that does not overlap the electron emission surface (see (e) of the figure). An example of contact electrode is Ti/Ni or the like.

(Step 7) The cover film 7 is deposited on the electron-transmitting electrode 3 (see (f) of the figure). The cover film 7 constitutes the electron emission surface. An example of the cover film is made of boron nitride having a hexagonal structure. A deposition method for the h-BN includes a method of transferring a hexagonal boron nitride film deposited on another substrate such as Cu or Ni—Fe alloy, a CVD method using ammonia borane ($H_6NB$), borazine ($B_3N_3H_6$), boron trichloride and ammonia, or diborane ($B_2H_6$) and ammonia ($NH_3$) as raw materials, or the like. A deposition method is not particularly limited.

An example of the CVD method for depositing h-BN will be described below. A heating device with a quartz tube inserted into a horizontal electric furnace is prepared. A pressure inside the quartz tube is lowered to about $5 \times 10^{-4}$ Pa with a vacuum pump, and then a temperature of the electric furnace is set to about 1050° C. Borazine ($B_3N_3H_6$) vapor is introduced from one side of the quartz tube, and the pressure inside the quartz tube is adjusted to about 30 Pa. The h-BN is deposited by introducing the borazine vapor for 30 minutes.

[Measurement of Characteristics of Electron Emitting Element]

Figure 4:
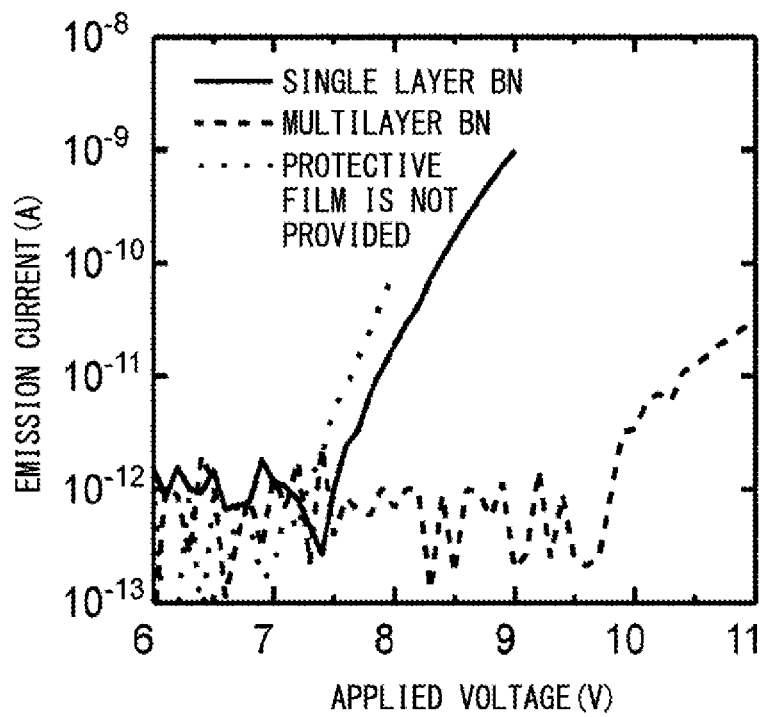
FIG. 4 is a diagram showing a comparison of electron emission characteristics of the electron emitting elements of the first embodiment and the comparative example.
Figure 5:
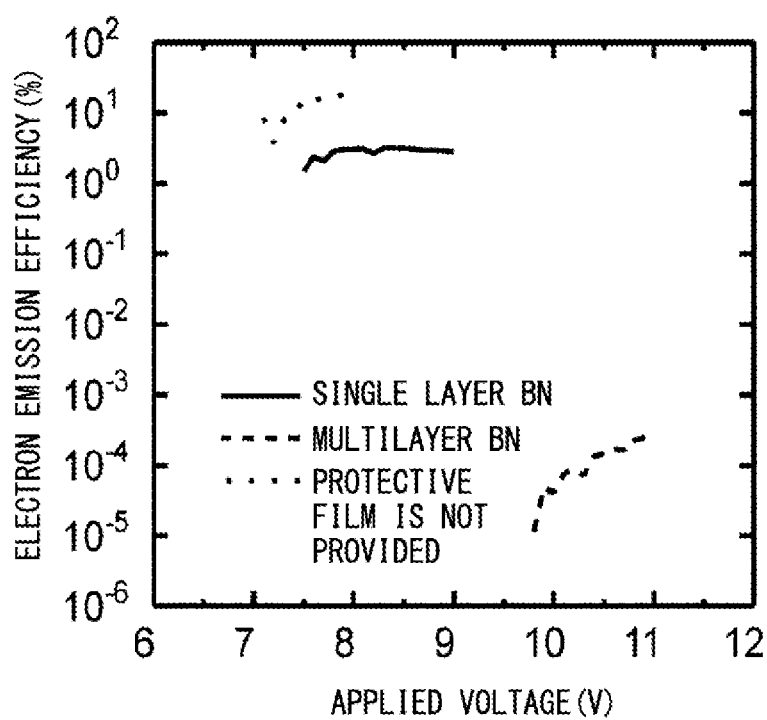
FIG. 5 is a diagram showing a comparison of electron emission efficiencies of the electron emitting elements of the first embodiment and the comparative example.

FIG. 4 shows a comparison of electron emission characteristics of electron emitting elements according to a presence or absence of the h-BN cover film. FIG. 5 shows a comparison of electron emission efficiencies of electron emitting elements according to a presence or absence of the h-BN cover film. An electron emitting element of the present embodiment including the lower electrode of a silicon semiconductor substrate (n-Si), the insulation film of $SiO_2$ (for example 10 nm), the electron-transmitting electrode of graphene (for example 1 nm), and the cover film of h-BN was prepared. An electron emitting element in which the h-BN cover film (hereinafter, also referred to as "single-layer BN") is made of a single-layer h-BN, and an electron emitting element in which the h-BN cover film (hereinafter, also referred to as "multilayer BN") is made of a multilayer h-BN (about 39 layers and a film thickness of 13 nm) were prepared. As comparative example 1, an electron emitting element in which a cover film was not provided was prepared. In FIGS. 4 and 5, a case of the single-layer BN was shown by a solid line, and a case of the multilayer BN was shown by a long dotted line. In FIGS. 4 and 5, a case of the electron emitting element of comparative example 1 in which the cover film is not provided (hereinafter, also referred to as "protective film is not provided") is shown by a dotted line.

For characteristic measurement, an evaluation of the electron emission characteristics of an obtained electron beam was performed in an ultra-high vacuum chamber. First, the lower electrode (cathode) was grounded, a voltage was applied to the electron-transmitting electrode (gate) in steps of 0.1 V from 0 V to about +20 V, +1000 V was applied to a SUS plate (anode) opposed to the electron emitting element, and then currents flowing through the lower electrode, the electron-transmitting electrode, and the SUS plate were measured.

As shown in FIG. 4, in a case of single-layer BN and a case in which a protective film is not provided, it was ascertained that electron emission started from an applied voltage of approximately 7.5 V and an emission current increased as the applied voltage increases. In a case of the single-layer BN, it was ascertained that an emission current density reached $10^{-9}$ A at an applied voltage of 9V and a sufficient emission current could be obtained. In a case of the multilayer BN, it was ascertained that electron emission started from an applied voltage of approximately 9 V, the emission current density reached $10^{-11}$ A or more at an applied voltage of 11V, and an emission current could be obtained. In a case of comparative example 1 in which a protective film is not provided, it was ascertained that the emission current density reached $10^{-10}$ A at an applied voltage of 8V and an emission current could be obtained. Next, as shown in FIG. 5, in a case of the single-layer BN, the electron emission efficiency is at a level of about $10^0$% at an applied voltage of 7 V to 9 V. In a case of the multilayer BN, the electron emission efficiency is in the vicinity of $10^{-4}$% at an applied voltage of 10 V to 11 V and is low. In a case of comparative example 1 in which a protective film is not provided, the electron emission efficiency is in the vicinity of $10^1$% at an applied voltage of 7 V to 8 V. In the electron emission characteristics, a starting voltage of electron emission tends to be high in the multilayer BN. On the other hand, in the single-layer BN, electron emission can be ascertained from a voltage that is almost the same as that of the case in which a protective film is not provided. This is because, as the number of layers of the BN increases, decrease in the electron emission efficiency due to electron scattering in the BN becomes significant. This is also clear from voltage dependence of the electron emission efficiency in FIG. 5. In the single-layer BN protective film, a decrease in electron emission efficiency is about 10% from the case in which a protective film is not provided, but the decrease is about 98% in the multilayer BN. However, the protection in the multilayer BN has a high ability to protect the device because a surface of the device is covered with a thick BN protective layer. It is effective in applications in which there is no problem even if power consumption is high, for example, in applications such as a gas reformer used in a deposition device and charge removal in an analysis device.

Figure 6:
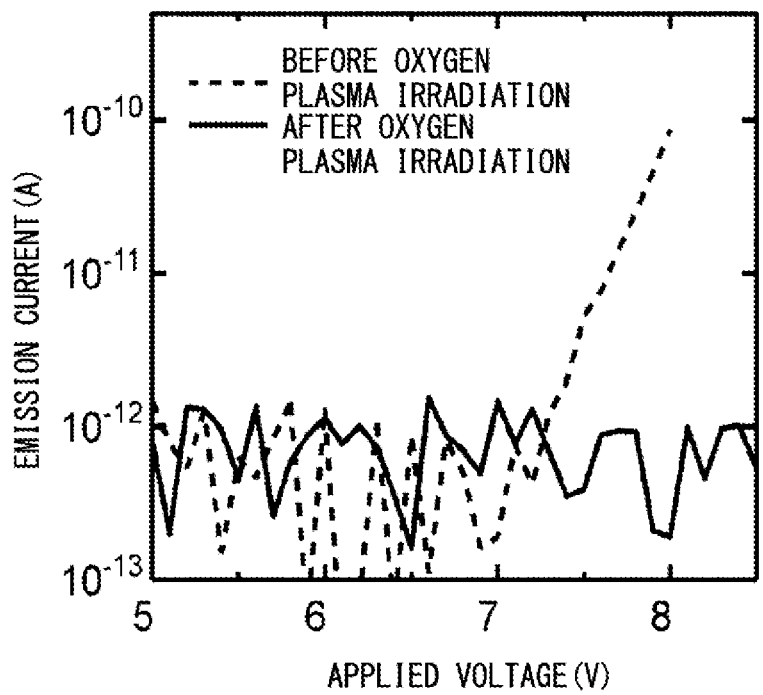
FIG. 6 is a diagram showing oxygen-resistant plasma characteristics of the electron emitting element of the comparative example.
Figure 7:
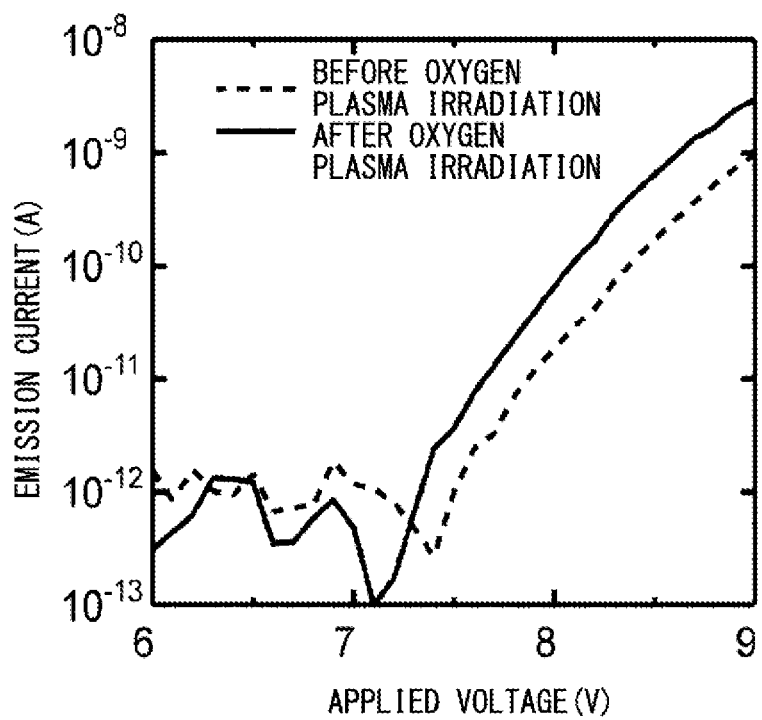
FIG. 7 is a diagram showing oxygen-resistant plasma characteristics of the electron emitting element of the first embodiment.
Figure 8:
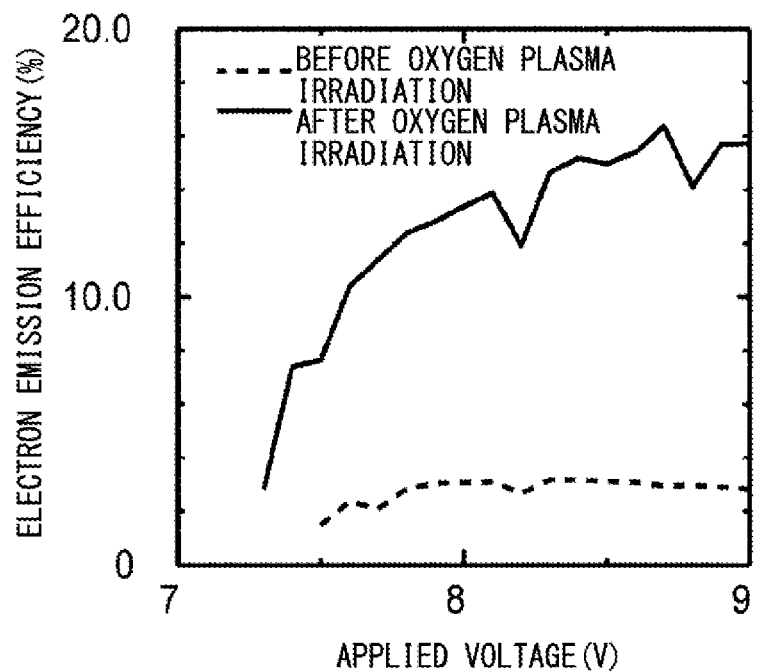
FIG. 8 is a diagram showing oxygen-resistant plasma characteristics of the electron emitting element of the first embodiment.
Figure 9:
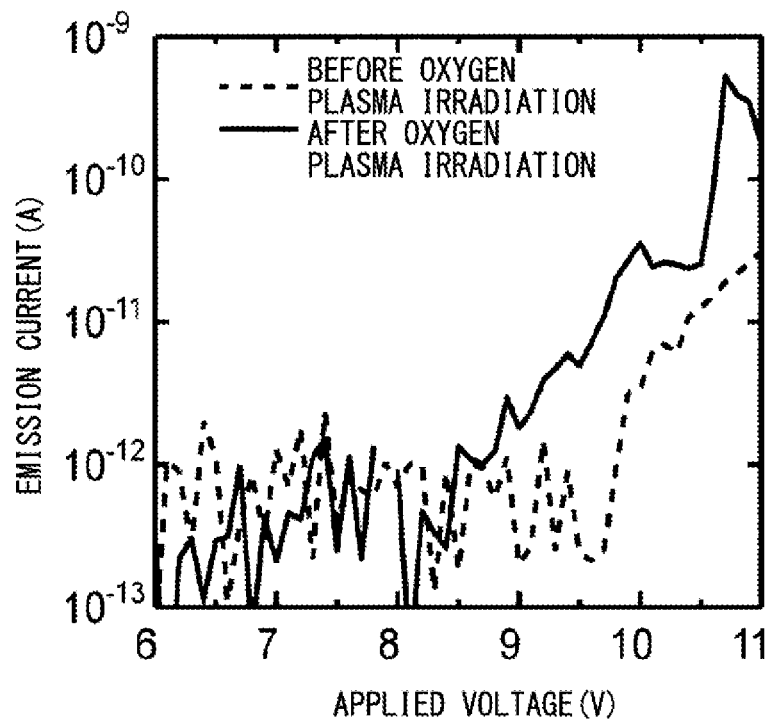
FIG. 9 is a diagram showing oxygen-resistant plasma characteristics of the electron emitting element of the first embodiment.
Figure 10:
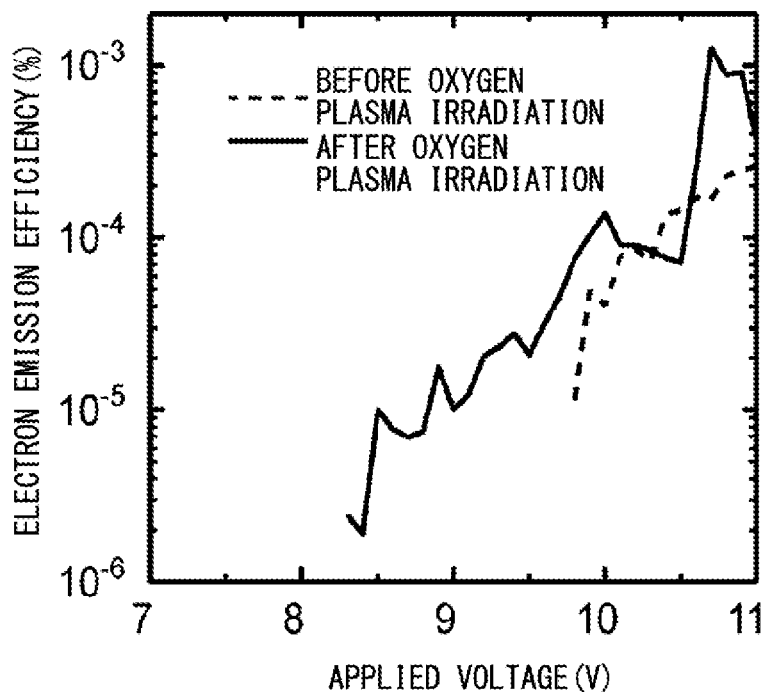
FIG. 10 is a diagram showing oxygen-resistant plasma characteristics of the electron emitting element of the first embodiment.

FIGS. 6 to 10 show a comparison of oxygen-resistant plasma characteristics of the electron emitting element. FIG. 6 shows a relationship between an applied voltage and an emission current before and after irradiation when the electron emitting element of comparative example 1 in which a protective film is not provided is irradiated with an oxygen plasma. FIG. 7 shows a relationship between an applied voltage and an emission current before and after irradiation in a case of the electron emitting element of the present embodiment having a protective film of the single-layer BN. FIG. 8 shows a relationship between an applied voltage and an electron emission efficiency before and after irradiation in the electron emitting element similar to that of FIG. 7. FIG. 9 shows a relationship between an applied voltage and an emission current before and after irradiation in a case of the electron emitting element in which a protective film of the multilayer BN is provided. FIG. 10 shows a relationship between an applied voltage and an electron emission efficiency before and after irradiation in the electron emitting element similar to that of FIG. 9. Table 1 shows a comparison table of maximum electron emission efficiencies before and after the oxygen plasma irradiation in the electron emitting element with the single-layer h-BN and the electron emitting element with the multilayer h-BN of the present embodiment, and the electron emitting element of the comparative example 1 in which a protective film is not provided.

TABLE 1

| | Before oxygen plasma irradiation | After oxygen plasma irradiation |
|---|---|---|
| Protective film being not provided | 18.1% | 0% |
| Single-layer h-BN | 3.17% | 16.4% |
| Multilayer h-BN | 0.00026% | 0.00126% |

From Table 1, in a case of comparative example 1 in which a protective film is not provided, the maximum electron emission efficiency is 0 after the oxygen plasma irradiation. This is because a surface of the electron-transmitting electrode of the electron emission surface is damaged and changed or the like by the oxygen plasma irradiation. On the other hand, it is ascertained that one having the single-layer or multilayer protective film increases in the maximum electron emission efficiency after the oxygen plasma irradiation. From this, the case with the multilayer h-BN also has oxygen resistance as in the case with the single layer compared to the case in which a protective film is not provided, and has an effect of being able to withstand use in an environment in which oxygen is present. The reason why the electron emission efficiency increases after the oxygen plasma irradiation is that organic residues adhering to a surface of h-BN, which is served as a protective film, in a manufacturing process is burnt down by the oxygen plasma irradiation, and a surface of the device is cleaned.

A film thickness of the cover film can be appropriately set in a range in which the cover film has a function of transmitting electrons and can serve the role of protecting the surface of the electron-transmitting electrode. The following will be described with taking h-BN as an example.

When h-BN is used as the cover film, it has been ascertained that electron emission is possible at 13 nm (about 39 layers). Therefore, when h-BN is used, 1 or more layers and 39 or less layers is preferable.

Figure 11:
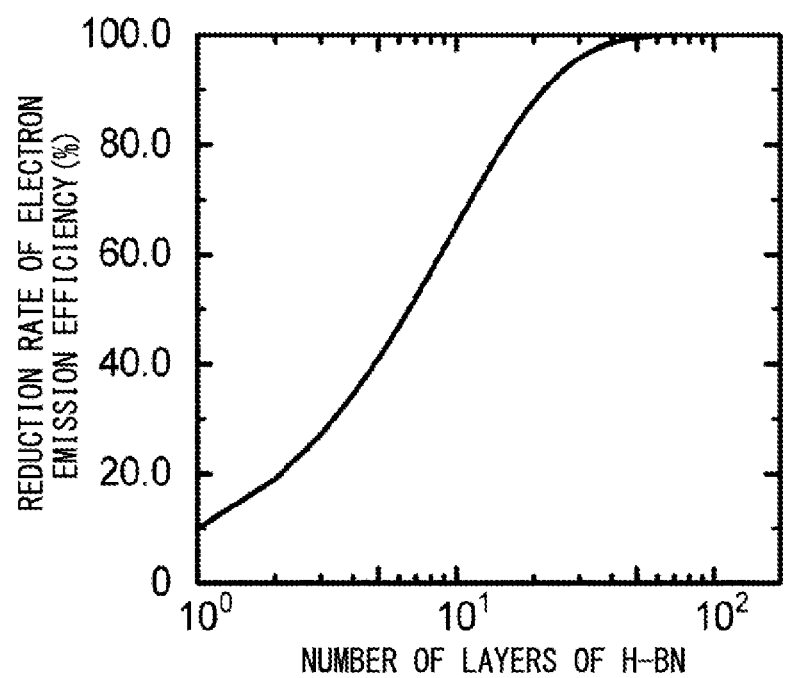
FIG. 11 is a diagram showing a relationship between the number of layers of h-BN and a reduction rate of an electron emission efficiency in the electron emitting element of the first embodiment.

FIG. 11 is a diagram showing a relationship between the number of layers of h-BN and a reduction rate of an electron emission efficiency. When an electron transmittance of the single-layer h-BN is calculated from the electron emission efficiencies after plasma irradiation in cases of "protective film not being provided" and the protective film with "single-layer h-BN" shown in Table 1, the electron transmittance is about 90%. From this, a relationship between the number of layers of h-BN and the reduction rate of the electron emission efficiency can be derived. Therefore, the number of layers is preferably 21 or less layers to keep the reduction rate of the electron emission efficiency within 90% in the state in which the protective film is not provided, the number of layers is preferably 11 or less layers to keep the reduction rate of the electron emission efficiency within 70%, the number of layers is preferably 6 or less layers to keep the reduction rate of the electron emission efficiency within 50%, the number of layers is preferably 3 or less layers to keep the reduction rate of the electron emission efficiency within 30%, and the number of layers is preferably 2 or less layers to keep the reduction rate of the electron emission efficiency within 20%.

Further, the examples shown in the above-described embodiments or the like are described for easy understanding of the invention, and are not limited to the present embodiment.

INDUSTRIAL APPLICABILITY

Since the electron emission surface of the electron emitting element of the present invention is resistant to oxygen or the like, the electron emitting element of the present invention can be employed for applications in gas atmospheres or liquids, or applications in harsh environments such as outer space, and thus is industrially useful.

REFERENCE SIGNS LIST

1 Lower electrode
2 Thick insulation film
3 Electron-transmitting electrode
4 Contact electrode
5, 305 Electron emission surface
6 Insulation film
7 Cover film
10, 300 Electron emitting element
301 Lower electrode substrate
302 Insulator layer
303 Electron-transmitting electrode layer
304 Contact electrode layer

The invention claimed is:

1. An electron emitting element comprising:
a laminated structure in which a first electrode, an electron accelerating layer made of an insulation film, a second electrode, and a cover film are laminated in that order, wherein
the second electrode is an electrode which transmits electrons and emits electrons from a surface thereof, and
the cover film is a film which transmits electrons, is a protective film made of a material different from that of the second electrode, and constitutes an electron emission surface thereof,
wherein the cover film is made of hexagonal boron nitride.

2. The electron emitting element according to claim 1, wherein the cover film is a film inert to oxygen or a film having higher corrosion resistance than the second electrode.

3. The electron emitting element according to claim 1, wherein a film thickness of the cover film is configured so that a reduction rate of an electron emission efficiency due to the cover film is 90% or less compared to a case without the cover film.

4. The electron emitting element according to claim 1, wherein the cover film is made of hexagonal boron nitride of 1 or more layers and 39 or less layers.

5. The electron emitting element according to claim 1, wherein the second electrode is a graphene film or a graphite film.

6. The electron emitting element according to claim 5, wherein the graphene film is a polycrystalline graphene film which consists of one carbon layer, and the graphite film is a polycrystalline graphite film which consists of 20 or less carbon layers.

7. The electron emitting element according to claim 5, wherein the graphene film and the graphite film are doped with nitrogen.

8. The electron emitting element according to claim 1, wherein the electron accelerating layer is made of hexagonal boron nitride.

9. The electron emitting element according to claim 1, wherein the second electrode is a metal electrode.

10. An electron emitting element comprising:
a laminated structure in which a first electrode, an electron accelerating layer made of an insulation film, a second electrode, and a cover film are laminated in that order, wherein the second electrode is an electrode which transmits electrons and emits electrons from a surface thereof, and the cover film is a film which transmits electrons, is a protective film made of a material different from that of the second electrode, and constitutes an electron emission surface thereof, wherein the cover film is (i) a film of one or two or more layers selected from $MoS_2$, $MoSe_2$, $WS_2$, $WSe_2$, GaS, and GaSe, or (ii) a film of one or two more layers selected from $SiO_2$, $Al_2O_3$, ZrO, $HfO_2$, and $TiO_2$.

11. The electron emitting element according to claim 10, wherein the second electrode is a graphene film or a graphite film.

12. The electron emitting element according to claim 11, wherein the graphene film is a polycrystalline graphene film which consists of one carbon layer, and the graphite film is a polycrystalline graphite film which consists of 20 or less carbon layers.

13. The electron emitting element according to claim 11, wherein the graphene film and the graphite film are doped with nitrogen.

14. The electron emitting element according to claim 10, wherein the second electrode is a metal electrode.

15. A manufacturing method for an electron emitting element comprising:
 a step of forming a first electrode;
 a step of forming a first insulation film, which limits a region of an electron emission surface, on a part of a surface of the first electrode;
 a step of forming an electron accelerating layer which is made of an insulation film and covers the first electrode and the first insulation film; and
 a step of forming a cover film, which transmits electrons, on a region of the electron emission surface of the electron accelerating layer,
wherein the cover film is a hexagonal boron nitride film, and
the hexagonal boron nitride film which covers the electron accelerating layer is formed in the step of forming the cover film by (i) transferring a hexagonal boron nitride film which is formed on a substrate on the region of the electron emission surface of the electron accelerating layer, or (ii) performing a chemical vapor deposition method using diborane and ammonia, boron trichloride and ammonia, ammonia borane, or borazine as raw materials.

* * * * *